United States Patent
Ichikawa et al.

(10) Patent No.: US 10,665,776 B2
(45) Date of Patent: May 26, 2020

(54) MAGNETORESISTANCE EFFECT ELEMENT AND METHOD FOR MANUFACTURING THE SAME

(71) Applicants: TDK CORPORATION, Tokyo (JP); NATIONAL INSTITUTE FOR MATERIALS SCIENCE, Tsukuba-shi, Ibaraki (JP)

(72) Inventors: Shinto Ichikawa, Tokyo (JP); Katsuyuki Nakada, Tokyo (JP); Seiji Mitani, Tsukuba (JP); Hiroaki Sukegawa, Tsukuba (JP); Kazuhiro Hono, Tsukuba (JP); Tadakatsu Ohkubo, Tsukuba (JP)

(73) Assignees: TDK CORPORATION, Tokyo (JP); NATIONAL INSTITUTE FOR MATERIALS SCIENCE, Tsukuba-shi (JP)

( * ) Notice: Subject to any disclaimer, the term of this patent is extended or adjusted under 35 U.S.C. 154(b) by 0 days.

(21) Appl. No.: 16/275,947

(22) Filed: Feb. 14, 2019

(65) Prior Publication Data

US 2019/0259937 A1 Aug. 22, 2019

(30) Foreign Application Priority Data

Feb. 16, 2018 (JP) .................. 2018-026487
Jan. 31, 2019 (JP) .................. 2019-015965

(51) Int. Cl.
*H01L 43/10* (2006.01)
*H01L 43/12* (2006.01)
*H01F 10/32* (2006.01)

(52) U.S. Cl.
CPC .............. *H01L 43/10* (2013.01); *H01L 43/12* (2013.01); *H01F 10/3286* (2013.01)

(58) Field of Classification Search
CPC ......... H01L 43/08; H01L 43/10; H01L 43/12; H01F 10/3286
See application file for complete search history.

(56) References Cited

U.S. PATENT DOCUMENTS

2012/0091548 A1   4/2012   Sukegawa et al.
2013/0003579 A1   1/2013   Lu et al.
2013/0221461 A1*  8/2013   Sukegawa ............ H01L 43/08
                                                         257/421

FOREIGN PATENT DOCUMENTS

JP   5586028 B2   9/2014
JP   5588019 B2   9/2014
(Continued)

OTHER PUBLICATIONS

H. Sukegawa et al., "Tunnel magnetoresistance with improved bias voltage dependence in lattice-matched Fe/spinel MgAl2O4/Fe(001) junctions"; Applied Physics Letters 96, 2010, pp. 212505-1-212505-3.

(Continued)

*Primary Examiner* — Changhyun Yi
(74) *Attorney, Agent, or Firm* — Oliff PLC

(57) ABSTRACT

Provided is a magnetoresistance effect element in which a tunnel barrier layer stably has a cation disordered spinel structure. This magnetoresistance effect element includes a first ferromagnetic layer, a second ferromagnetic layer, and a tunnel barrier layer disposed between the first ferromagnetic layer and the second ferromagnetic layer. In addition, the tunnel barrier layer is an oxide of $Mg_xAl_{1-x}$ ($0 \leq x < 1$) and an amount of oxygen in the tunnel barrier layer is lower than an amount of oxygen in a fully oxidized state in which the oxide has an ordered spinel structure.

16 Claims, 3 Drawing Sheets

(56) References Cited

FOREIGN PATENT DOCUMENTS

JP          5988019 B2      9/2016
JP       2017-183355 A     10/2017

OTHER PUBLICATIONS

Y. Miura et al., "First-principles study of tunneling magentoresistance in Fe/MgAl2O4/Fe(001) magentic tunnel junctions", Physical Review B 86, 2012, pp. 024426-1-024426-6.

T. Scheike et al., "Lattice-matched magnetic tunnel junctions using a Heusler alloy Co2FeAl and a cation-disorder spinel Mg—Al—O barrier" Applied Physics Letters 105, 2014, pp. 242407-1-242407-5.

* cited by examiner

○ O
◎ Tetrahedral interstices
☐ Octashedral interstices

MAGNETORESISTANCE EFFECT ELEMENT AND METHOD FOR MANUFACTURING THE SAME

BACKGROUND OF THE INVENTION

Field of the Invention

The present disclosure relates to a magnetoresistance effect element and a method for manufacturing the same.

Priority is claimed on Japanese Patent Application No. 2018-26487, filed Feb. 16, 2018 and Japanese Patent Application No. 2019-015965, filed Jan. 31, 2019, the contents of which are incorporated herein by reference.

Description of Related Art

A giant magnetoresistance (GMR) element constituted of a multilayer film of a ferromagnetic layer and a nonmagnetic layer and a tunneling magnetoresistance (TMR) element using an insulating layer (a tunnel barrier layer and a barrier layer) for a nonmagnetic layer are known. Generally, although a TMR element has a higher element resistance than a GMR element, the TMR element has a high magnetoresistance (MR) ratio. TMR elements are attracting attention as elements for magnetic sensors, high frequency components, magnetic heads, and nonvolatile magnetoresistive random access memory (MRAM) elements.

TMR elements can be classified into two types in accordance with a difference between electron tunnel conduction mechanisms. One of the two types is a TMR element using only a penetration effect (a tunneling effect) of wave functions between ferromagnetic layers. The other thereof is a TMR element in which coherent tunneling using specific orbital transport of nonmagnetic insulating layers, which are tunneled when a tunneling effect is produced (in which only electrons having symmetric property of a specific wave function perform tunneling) is dominant. It is known that a TMR element in which coherent tunneling is dominant can have a larger MR ratio than a TMR element using only a tunneling effect.

In order to obtain a coherent tunneling effect in a magnetoresistance effect element, it is necessary for two ferromagnetic metal layers and tunnel barrier layer to be mutually crystalline and for interfaces between the two ferromagnetic metal layers and the tunnel barrier layer to be crystallographically continuous.

MgO is widely known as a tunnel barrier layer capable of obtaining the coherent tunneling effect. Furthermore, materials to replace MgO are being studied. For example, it is possible to improve the lattice matching with a ferromagnetic substance using a ternary oxide (Mg—Al—O) made of Mg, Al, and O as compared with MgO. This is known to be preferable in view of the ability to obtain a higher MR output (smaller bias voltage dependence) when a bias voltage higher than that of the conventional MgO is applied.

For example, Japanese Patent No. 5586028 associated with the proposal of the applicant of the present application discloses that $MgAl_2O_4$ having a spinel type crystal structure can be used as a tunnel barrier layer. However, since a region of a composition in which a spinel structure is stable is very limited, there is a problem that an adaptation range is narrow.

On the other hand, Japanese Patent No. 5988019 associated with the proposal of the applicant of the present application includes a ternary oxide (Mg—Al—O) which has a structure different from a spinel structure and has a cubic crystal (a cation disordered spinel structure) having a lattice constant which is half that of a spinel structure. Since a cation disordered spinel structure is a metastable structure, it is possible to form a tunnel barrier layer without being limited to a stoichiometric composition of a spinel type structure. For this reason, since lattice constants can be continuously changed by adjusting a wide Mg—Al composition ratio, further improvements in the lattice matching of the TMR element are expected. As a result, for example, the bias voltage dependence of the MR ratio can be further reduced.

In addition, Japanese Patent No. 5988019 discloses that the occurrence of a physical mechanism called a band folding effect can be minimized and a large MR ratio can be stably obtained by combining a barrier of a cation disordered spinel structure and a BCC type Co—Fe-based ferromagnetic electrode.

SUMMARY OF THE INVENTION

However, a method for stably obtaining a metastable cation disordered spinel structure as a very thin barrier layer of about nanometers is not established. For example, with regard to an oxygen composition, Japanese Patent No. 5988019 includes the expression "oxygen in a cation disordered spinel structure may be deficient or excessive" and a relationship with a crystal structure is not clear. For this reason, there is a practical problem that it is necessary to distinguish a crystal structure of the tunnel barrier layer for each element using advanced microstructure analysis technology requiring long inspection time and high inspection cost. This problem is due to the fact that the necessary requirements for obtaining a disordered structure are not clarified.

The present disclosure was made in view of such circumstances and an objective of the present disclosure is to stably obtain a cation disordered spinel structure as a tunnel barrier layer of a TMR element.

The inventors of the present disclosure have found that there is a strong correlation between an amount of oxygen in a tunnel barrier layer and a crystal structure in a process of producing a TMR element having an Mg—Al—O tunnel barrier under various conditions and performing a microstructure analysis. Particularly, they found that a cation disordered spinel structure can be stably obtained in an oxygen deficient state relative to a predetermined amount of oxygen predicted from amounts of Mg and Al. Furthermore, for example, also in post-oxidation illustrated in Japanese Patent No. 5988019 associated with the proposal of the applicant and multi-step post-oxidation illustrated in Japanese Patent Application No. 2017-183355 associated with the proposal of the applicant, they found that a cation disordered spinel structure can be produced regardless of a Mg—Al composition ratio.

That is to say, in order to accomplish the above objective, the present disclosure provides the following means.

(1) A magnetoresistance effect element according to a first aspect includes: a first ferromagnetic layer; a second ferromagnetic layer; and a tunnel barrier layer disposed between the first ferromagnetic layer and the second ferromagnetic layer, wherein the tunnel barrier layer is an oxide of $Mg_xAl_{1-x}$ ($0 \leq x < 1$) and an amount of oxygen in the tunnel barrier layer is lower than an amount of oxygen in a fully oxidized state in which the oxide has an ordered spinel structure.

(2) In the magnetoresistance effect element according to the above aspect, the amount of oxygen in the tunnel barrier layer may be 67% or more of the amount of oxygen in the fully oxidized state.

(3) In the magnetoresistance effect element according to the above aspect, the amount of oxygen in the tunnel barrier layer may be 67% or more and 95% or less of the amount of oxygen in the fully oxidized state.

(4) In the magnetoresistance effect element according to the above aspect, the amount of oxygen in the tunnel barrier layer may be 77% or more and 95% or less of the amount of oxygen in the fully oxidized state.

(5) In the magnetoresistance effect element according to the above aspect, the oxide may be expressed by a composition expression of $Mg_\alpha Al_\beta O_\gamma$ and α may satisfy $0 \leq \alpha \leq 0.41$ in the composition expression.

(6) In the magnetoresistance effect element according to the above aspect, a may satisfy $0.13 \leq \alpha \leq 0.41$ in the composition expression.

(7) In the magnetoresistance effect element according to the above aspect, a crystal mainly constituting the tunnel barrier layer may be (001)-oriented.

(8) In the magnetoresistance effect element according to the above aspect, at least one of the first ferromagnetic layer and the second ferromagnetic layer may contain the element Fe.

(9) In the magnetoresistance effect element according to the above aspect, a thickness of the tunnel barrier layer may be 3 nm or less.

(10) A method for manufacturing a magnetoresistance effect element according to a second aspect is a method for manufacturing the magnetoresistance effect element according to the above aspect which includes a step of preparing a target made of the oxide; and a step of laminating the tunnel barrier layer using the target.

(11) A method for manufacturing a magnetoresistance effect element according to a third aspect is a method for manufacturing the magnetoresistance effect element according to the above aspect which includes a step of depositing an alloy expressed by a composition expression of $Mg_x Al_{1-x}$ (where, $0 \leq x < 1$); and a step of oxidizing the alloy to form the tunnel barrier layer.

(12) In the method for manufacturing a magnetoresistance effect element according to the third aspect, an alloy expressed by a composition expression of $Mg_x Al_{1-x}$ (where, $0 \leq x < 0.5$) may be deposited in the step of depositing an alloy, and each of the step of depositing an alloy and the step of oxidizing the alloy performed after the step of depositing may be performed only once.

(13) In the method for manufacturing a magnetoresistance effect element according to the third aspect, an alloy expressed by a composition expression of $Mg_x Al_{1-x}$ (where, $0.5 \leq x < 1$) may be deposited in the step of depositing an alloy, and each of the step of depositing an alloy and the step of oxidizing the alloy performed after the step of depositing may be repeated multiple times.

(14) The method for manufacturing a magnetoresistance effect element according to the third aspect may further includes a step of depositing Mg after performing the step of depositing an alloy and the step of oxidizing the alloy.

(15) A method for manufacturing a magnetoresistance effect element according to a fourth aspect is a method for manufacturing the above-described magnetoresistance effect element, the method includes a step of depositing an alloy expressed by a composition expression of $Mg_x Al_{1-x}$ (where, $0 \leq x < 1$) in a metal mode or a transition mode while the alloy is oxidized by reactive deposition.

(16) The method for manufacturing a magnetoresistance effect element according to the fourth aspect may further includes a step of depositing Mg after performing the step of depositing an alloy in the metal mode or the transition mode while the alloy is oxidized by reactive deposition.

According to the present disclosure, a cation disordered spinel structure can be stably obtained.

DETAILED DESCRIPTION OF THE INVENTION

Figure 1:
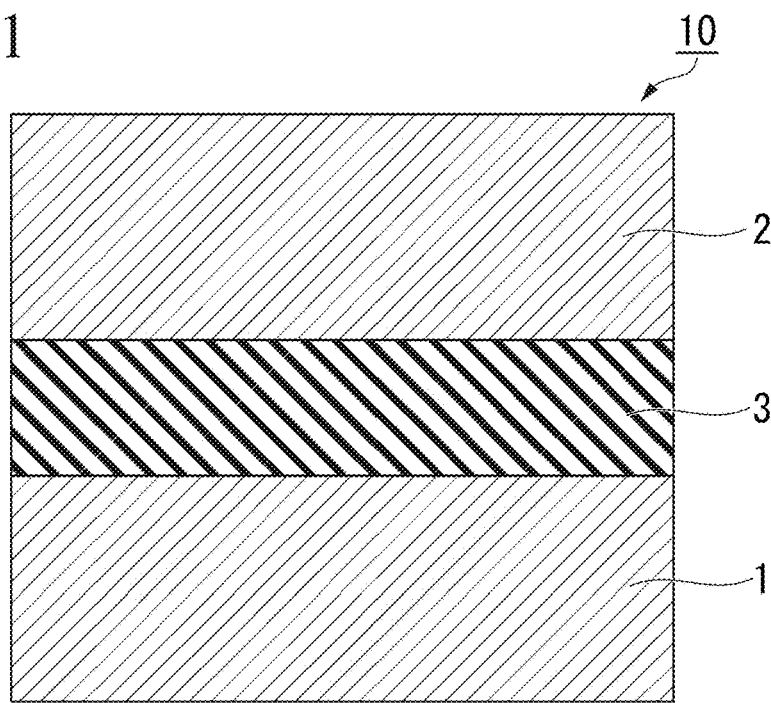
FIG. 1 is a schematic cross-sectional view of a magnetoresistance effect element according to an embodiment.

The present disclosure will be described in detail below with reference to the drawings as appropriate. In the drawings used in the following description, in order to facilitate the understanding of the features of the present disclosure, the characteristic parts are illustrated in an enlarged manner for the sake of convenience in some cases. In addition, a dimensional ratio of each constituent element is different from the actual ratio in some cases. Materials, dimensions, and the like exemplified in the following description are merely examples, the present disclosure is not limited thereto, and it is possible to carry out the present by appropriately performing modification within a range in which the gist thereof is not changed.

"Magnetoresistance Effect Element"

FIG. 1 is a schematic cross-sectional view of a magnetoresistance effect element according to an embodiment. The magnetoresistance effect element 10 illustrated in FIG. 1 includes a first ferromagnetic layer 1, a second ferromagnetic layer 2, and a tunnel barrier layer 3. Furthermore, in addition to these layers, the magnetoresistance effect element 10 may include a cap layer, an underlayer, and the like.

(First Ferromagnetic Layer and Second Ferromagnetic Layer)

The first ferromagnetic layer 1 and the second ferromagnetic layer 2 have magnetizations. The magnetoresistance effect element 10 outputs a change in relative angle of these magnetizations as a change in resistance value. For example, when a magnetization orientation of the second ferromagnetic layer 2 is fixed and a magnetization orientation of the first ferromagnetic layer 1 is set to be variable with respect to the magnetization orientation of the second ferromagnetic layer 2, the magnetization orientation of the first ferromagnetic layer 1 changes and thus a resistance value of the magnetoresistance effect element 10 changes. A layer whose magnetization orientation is fixed is generally referred to as a fixed layer and a layer whose magnetization orientation is variable is generally referred to as a free layer. A case in which the first ferromagnetic layer 1 is a free layer and the second ferromagnetic layer 2 is a fixed layer will be described below as an example.

A ferromagnetic material can be used for the first ferromagnetic layer 1 and the second ferromagnetic layer 2. Examples thereof include a metal selected from the group consisting of Cr, Mn, Co, Fe, and Ni, an alloy containing at least one metal selected from the group, or an alloy containing one or more metals selected from the group and at least one or more of the elements B, C, and N. Particularly, it is desirable that the first ferromagnetic layer 1 and the second ferromagnetic layer 2 contain the element Fe. By including the element Fe in the first ferromagnetic layer 1 and the second ferromagnetic layer 2, it is possible to increase a spin polarization and an MR ratio of the magnetoresistance effect element 10. Specific examples of the first ferromagnetic layer 1 and the second ferromagnetic layer 2 containing the element Fe include Fe, Co—Fe, Co—Fe—B, and Ni—Fe.

Also, a Heusler alloy such as $Co_2FeSi$ can be used for the first ferromagnetic layer 1 and the second ferromagnetic layer 2. The Heusler alloy has a high spin polarization and can realize a high MR ratio. The Heusler alloy contains an intermetallic compound having a chemical composition of $X_2YZ$. X represents Co, Fe, or Ni in the periodic table, a Cu-group transition metal element, or a noble metal element. Y represents a Mn-, V-, Cr-, or Ti-group transition metal and can also represent the element represented by X. Z represents Group III to Group V typical elements. For example, examples thereof include $Co_2FeSi$, $Co_2MnSi$, $Co_2Mn_{1-a}Fe_aAl_bSi_{1-b}$, and the like.

When the magnetization orientations of the first ferromagnetic layer 1 and the second ferromagnetic layer 2 are set to be perpendicular to lamination surfaces, it is desirable that thicknesses thereof be 3 nm or less. Perpendicular magnetic anisotropy is induced in the first ferromagnetic layer 1 and the second ferromagnetic layer 2 at interfaces between the first ferromagnetic layer 1 and the second ferromagnetic layer 2 and the tunnel barrier layer 3. Since the effect of the perpendicular magnetic anisotropy is attenuated by increasing film thicknesses of the first ferromagnetic layer 1 and the second ferromagnetic layer 2, it is desirable that the film thicknesses of the first ferromagnetic layer 1 and the second ferromagnetic layer 2 be thin.

In order to set the second ferromagnetic layer 2 as a fixed layer, the coercivity of the second ferromagnetic layer 2 is set to be larger than that of the first ferromagnetic layer 1. When an antiferromagnetic material such as IrMn and PtMn is brought into contact with the second ferromagnetic layer 2, for example, the coercivity of the second ferromagnetic layer 2 increases. Furthermore, in order to prevent the leakage magnetic field of the second ferromagnetic layer 2 from affecting the first ferromagnetic layer 1, the second ferromagnetic layer 2 may have a synthetic ferromagnetic coupling structure.

(Tunnel Barrier Layer)

Figure 2:
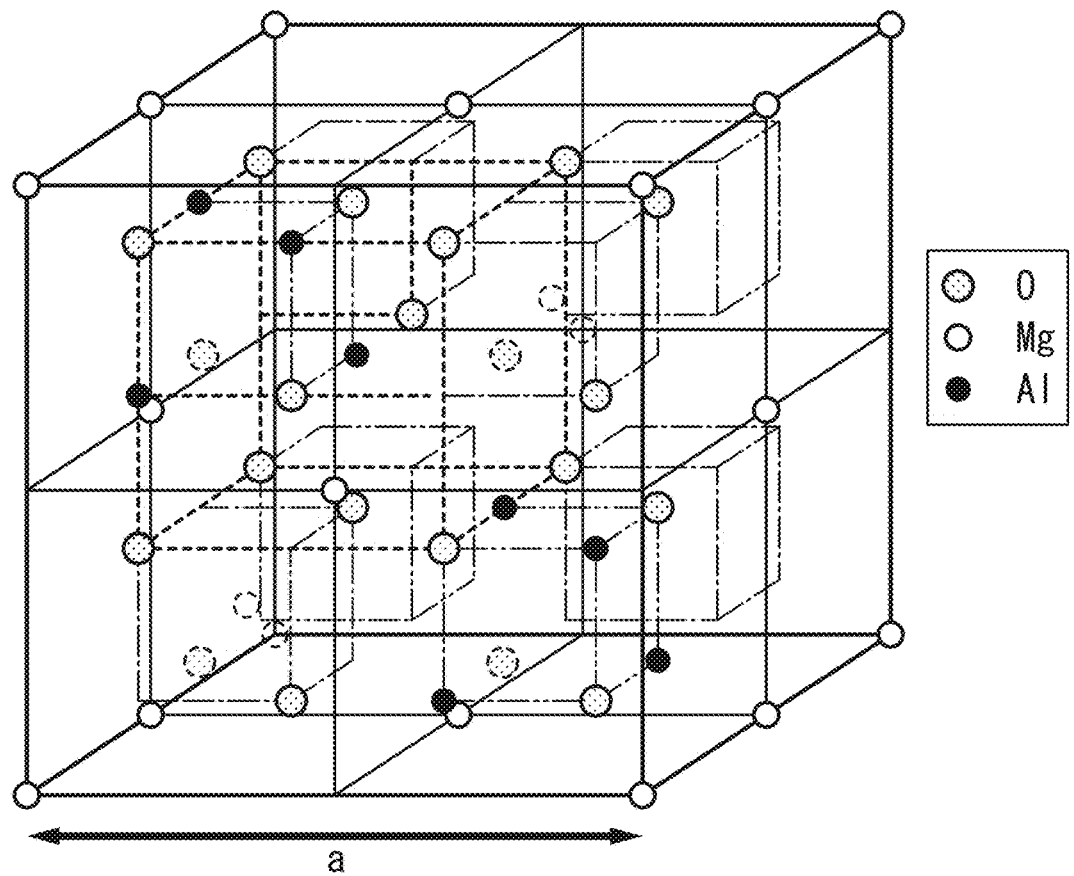
FIG. 2 is a diagram showing a crystal structure of a spinel structure.

The tunnel barrier layer 3 is an oxide of $Mg_xAl_{1-x}$. This oxide is expressed by a composition expression of $Mg_\alpha Al_\beta O_\gamma$. When the oxide has a stoichiometric composition, $\alpha+\beta+\gamma=1$ is satisfied and electrical neutrality is maintained. When the oxide is in a fully oxidized state, the tunnel barrier layer has an ordered spinel structure. FIG. 2 is a diagram schematically showing a crystal structure of the spinel structure.

Here, the fully oxidized state means that the oxide contains a predetermined amount or more of oxygen. For example, a stoichiometric composition is one of indicators indicating the content of oxygen. An ideal value of $\gamma$ in the stoichiometric composition is determined to satisfy electrical neutrality conditions of ionized Mg and Al ($Mg^{2+}$ and $Al^{3+}$) and oxygen ions $O^{2-}$. For this reason, $\gamma$ changes in a stoichiometric composition in accordance with a $Mg_xAl_{1-x}$ composition before oxidation treatment is performed. For example, a composition expression when a $Mg_{33}Al_{67}$ alloy layer is fully oxidized and is an oxide layer with a stoichiometric composition is $MgAl_2O_4$ and $\alpha=0.14$, $\beta=0.29$, and $\gamma=0.57$ are obtained. Furthermore, a composition expression when a pure Al layer is fully oxidized and is an oxide layer with a stoichiometric composition is $Al_2O_3$ and $\alpha=0$, $\beta=0.4$, and $\gamma=0.6$ are obtained.

When the oxide satisfies a stoichiometric composition, the oxide is theoretically fully oxidized. However, due to the accuracy of an analytical device, even if a compositionally analyzed oxide satisfies a stoichiometric composition, the compositionally analyzed oxide is not fully oxidized in some cases. Thus, a case in which the following relationship serving as an actually measured value is satisfied is defined as a fully oxidized state:

$$\gamma \geq \{(2\times\alpha+3\times\beta)/2\}\times 1.12.$$

In the tunnel barrier layer 3 according to the embodiment, an amount of oxygen is small with respect to an amount of oxygen $\gamma$ in a fully oxidized state of the tunnel barrier layer 3 and oxygen in the tunnel barrier layer 3 is substantially defective. When the tunnel barrier layer 3 satisfies this relationship, a crystal structure of the tunnel barrier layer 3 is a cation disordered spinel structure (hereinafter referred to as "a disordered spinel structure" in some cases). Here, the expression "substantially defective" includes not only a state in which oxygen vacancies are present in oxide crystals but also a state in which some metal atoms such as Mg and Al remain unoxidized.

An amount of oxygen in the tunnel barrier layer 3 is preferably 67% or more and 95% or less and more preferably 77% or more and 95% or less of the amount of oxygen $\gamma$ in a substantially fully oxidized state. When the amount of oxygen $\gamma$ is within a range of 67% or more and 95% or less, even in the case of $\alpha=0$, the crystal structure of the tunnel barrier layer 3 stabilizes in a disordered spinel structure.

An amount of Mg in the tunnel barrier layer 3 is preferably $0 \leq \alpha \leq 0.41$ and more preferably $0.13 \leq \alpha \leq 0.41$. When a range of $\alpha$ is within this range, the crystal structure of the tunnel barrier layer 3 further stabilizes in a disordered spinel structure.

Figure 3:
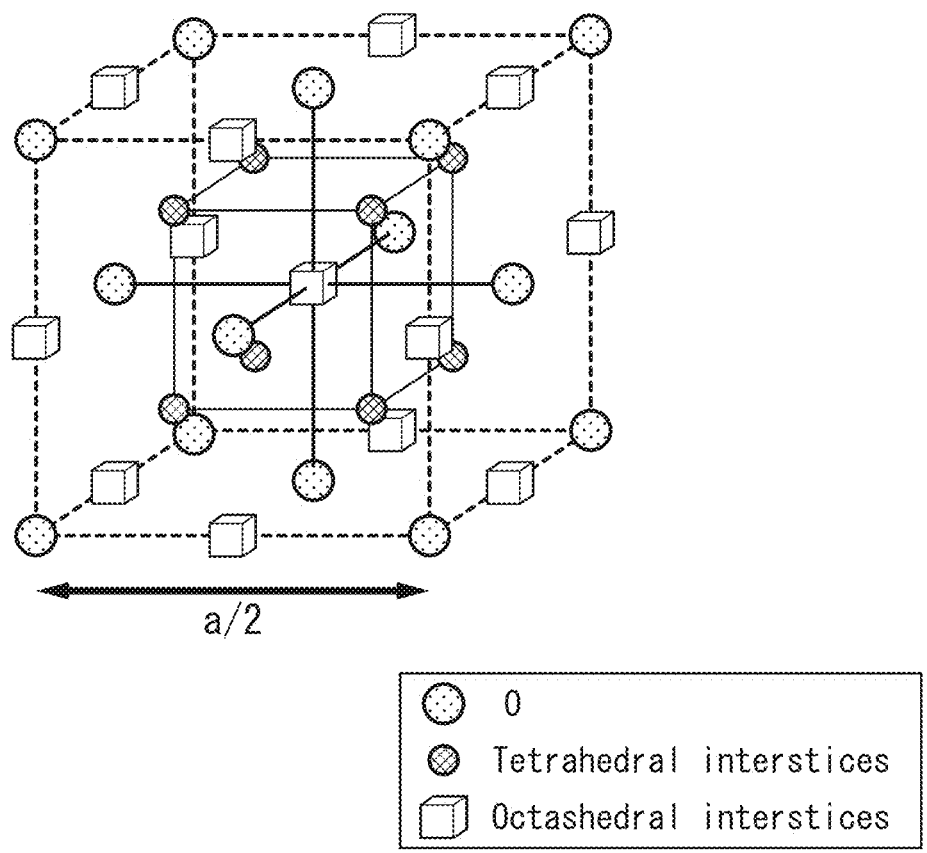
FIG. 3 is a diagram showing a crystal structure of a disordered spinel structure.

FIG. 3 is a diagram schematically showing a crystal structure of a cation disordered spinel structure. As illustrated in FIG. 2, in the case of an ordered spinel structure, a site at which the element Mg is ionized and enters and a site at which the element Al is ionized and enters are fixed. For this reason, the arrangement of these elements is regular. On the other hand, in the case of a disordered spinel structure, the element Mg or the element Al can exist in either of a site tetrahedrally coordinated with respect to oxygen and a site octahedrally coordinated with respect to oxygen illustrated in FIG. 3. A case in which determination of a site at which the element Mg and the element Al enter is regarded to be randomly performed corresponds to a disordered spinel structure. A lattice constant (a/2) of this disordered spinel structure is half a lattice constant (a) of the ordered spinel structure. The disordered spinel structure has the symmetry of a space group of Fm-3m or the symmetry of a space group of F-43m.

When a composition of the tunnel barrier layer 3 is in a fully oxidized state, a spinel structure in which the crystal structure of the tunnel barrier layer 3 is ordered stabilizes.

On the other hand, when the oxygen in the tunnel barrier layer 3 is set to be less than that of the fully oxidized state, the crystal structure of the tunnel barrier layer 3 further stabilizes in the disordered spinel structure. The amount of oxygen γ in the tunnel barrier layer 3 is preferably 67% or more of the amount of oxygen in a case in which the oxide is in the fully oxidized state (has a substantially stoichiometric composition). When the tunnel barrier layer 3 satisfies this relationship, even when an amount of magnesium a in the tunnel barrier layer 3 is 0, the crystal structure of the tunnel barrier layer 3 further stabilizes in a disordered spinel structure.

The reason why the crystal structure of the tunnel barrier layer 3 easily stabilizes in a disordered spinel structure when a composition thereof is set to an oxygen deficient composition is not clear, but the reason is conceivable as follows.

It is greatly influenced by an energy potential whether the element Mg and the element Al enter any of a tetrahedral coordination site and an octahedral coordination site with respect to oxygen. When a sufficient amount of oxygen is supplied, in view of the energy potential, sites at which the element Mg and the element Al stabilize are fixed. Furthermore, the energy is the lowest due to actions of ionic radii of $Mg^{2+}$ and $Al^{3+}$, a Coulomb repulsion force, and the like when these ions are regularly arranged. Thus, the ordered spinel structure stabilizes. For this reason, it is difficult to obtain a disordered spinel structure as the tunnel barrier layer 3.

On the other hand, in the oxygen deficient tunnel barrier layer 3, the element oxygen illustrated in FIGS. 2 and 3 is deficient from a predetermined position. When the element oxygen is deficient, a crystal structure is disturbed because an element which supports a crystal lattice is removed. When the crystal structure is disturbed, the energy states at a tetrahedral coordination site and an octahedral coordination site are also disturbed with respect to oxygen. When the energy state is disturbed, the element Mg which needs to stabilize at a tetrahedral coordination site with respect to oxygen stabilizes at an octahedral coordination site with respect to oxygen and vice versa. Furthermore, in the ordered spinel structure, the element Mg occupies a tetrahedral coordination site and an octahedral coordination site which are vacancies in some cases. That is to say, it is totally randomly determined whether the element Mg and the element Al enter any sites, and as a result, it is easy to stabilize in a more disordered spinel structure.

A thickness of the tunnel barrier layer 3 is preferably 3 nm or less. When the thickness of the tunnel barrier layer 3 is 3 nm or less, wave functions of the first ferromagnetic layer 1 and the second ferromagnetic layer 2 easily overlap each other beyond the tunnel barrier layer 3 and a tunneling effect and a coherent tunneling effect of the wave functions between the ferromagnetic layers can be easily obtained.

Also, it is desirable that a crystal mainly constituting the tunnel barrier layer 3 be (001)-oriented. "The crystal mainly constituting the tunnel barrier layer 3" includes both a case in which the tunnel barrier layer 3 is a (001)-oriented single crystal and a case in which the tunnel barrier layer 3 is polycrystalline and this polycrystal mainly consists of (001)-oriented textured crystals. When the tunnel barrier layer 3 is (001)-oriented, the lattice matching between the first ferromagnetic layer 1 and the second ferromagnetic layer 2 increases and a coherent tunneling effect is easily obtained. Particularly, in the case of an Fe, Co—Fe, Co-based Heusler alloy or the like in which the first ferromagnetic layer 1 or the second ferromagnetic layer 2 contains the element Fe, the lattice matching increases.

As described above, in the magnetoresistance effect element according to the embodiment, the tunnel barrier layer 3 has a predetermined composition and thus the crystal structure of the tunnel barrier layer 3 has a disordered spinel structure. In this disordered spinel structure, the effective lattice constant is halved compared to the ordered spinel structure, and as a result, the MR ratio can be increased. This is because an energy band structure of the disordered spinel structure is similar to the ordered spinel structure and can maintain the coherent tunneling effect. That is to say, by setting the crystal structure of the tunnel barrier layer 3 to the disordered spinel structure, it is possible to maintain the coherent tunneling effect and the good lattice matching and the MR ratio of the magnetoresistance effect element 10 increases.

The magnetoresistance effect element according to the present embodiment may have a barrier under layer of a composition ratio $Mg_zAl_{1-z}$ (0≤z≤1) between the oxide layer of $Mg_xAl_{1-x}$ and the first ferromagnetic layer 1 or the second ferromagnetic layer 2. The barrier underlayer becomes a part of the tunnel barrier layer which is an oxide of $Mg_xAl_{1-x}$ by a subsequent heat treatment.

Further, a Mg layer may be provided on the surface of the oxide layer of $Mg_xAl_{1-x}$ opposite to the barrier underlying layer. The thickness of the Mg layer can be, for example, 0.1 to 1 nm. The Mg layer becomes a part of the tunnel barrier layer which is an oxide of $Mg_xAl_{1-x}$ by a subsequent heat treatment.

(Shape and Dimension of Element)

A laminate including the first ferromagnetic layer 1, the tunnel barrier layer 3, and the second ferromagnetic layer 2 constituting the magnetoresistance effect element 10 has a columnar shape. Although a shape of the laminate in a plan view can have various shapes such as a circle, a quadrangle, a triangle, and a polygon, in terms of symmetry, the shape preferably has a circle. That is to say, the laminate preferably has a cylindrical shape.

When the laminate has a cylindrical shape, a diameter of the laminate in a plan view is preferably 80 nm or less, more preferably 60 nm or less, and still more preferably 30 nm or less. When the diameter is 80 nm or less, it is easy to suppress a domain structure in ferromagnetism and it is not necessary to consider a component different from spin polarization in a ferromagnetic metal layer. In addition, when the diameter is 30 nm or less, a single domain structure is formed in the ferromagnetic layer and a magnetization rotational speed and probability are improved. Furthermore, in a miniaturized magnetoresistance effect element, particularly, there is a strong demand for increasing resistance.

(Others)

In the embodiment, examples of the magnetoresistance effect element 10 include an example of a top pin structure in which the first ferromagnetic layer 1 is set as a free layer and the second ferromagnetic layer 2 is set as a fixed layer. However, a structure of the magnetoresistance effect element 10 is not limited to this case and may be a bottom pin structure.

The magnetoresistance effect element using the embodiment can be used as a magnetic sensor or a memory such as an MRAM.

"Method for Manufacturing Magnetoresistance Effect Element"

A method for manufacturing a magnetoresistance effect element will be described below. The method for manufacturing a magnetoresistance effect element according to this embodiment includes a step of laminating a first ferromagnetic layer, a tunnel barrier layer, and a second ferromagnetic layer. As methods for forming these layers, known methods such as a sputtering method, an evaporation method, a laser ablation method, and a molecular beam epitaxy (MBE) method can be used.

The tunnel barrier layer can be produced by, for example, any of the following three methods.

A first method includes preparing a target for the oxide having the same composition as the produced tunnel barrier layer and laminating the tunnel barrier layer using the target. In this method, since a target having a predetermined composition is prepared from the beginning, the composition of the tunnel barrier layer is easily converted into an oxygen deficient state.

A second method includes first laminating an alloy expressed by $Mg_xAl_{1-x}$ (where, $0 \leq x < 1$) and forming a tunnel barrier layer by oxidizing the alloy. The oxidation is performed through plasma oxidation or oxygen introduction. At that time, the oxidation is performed by controlling a flow rate of oxygen to be introduced, a pressure in an oxidation treatment chamber, and an oxidation time and adjusting an amount of oxygen for the alloy is adjusted so that the finally obtained tunnel barrier layer has an oxygen deficient state. By performing this treatment, the tunnel barrier layer has an oxygen deficient state and the crystal structure of the tunnel barrier layer has a disordered spinel structure.

In the second method, each of the step of depositing an alloy expressed by a composition expression of $Mg_xAl_{1-x}$ (where, $0 \leq x < 0.5$) and the step of oxidizing the alloy performed after the step of depositing may be performed only once. Alternatively, in the second method, each of the step of depositing an alloy expressed by a composition expression of $Mg_xAl_{1-x}$ (where, $0.5 \leq x < 1$) and the step of oxidizing the alloy performed after the step of depositing may be repeated multiple times.

A third method includes introducing oxygen into a chamber during film formation of an MgAl alloy and performing lamination while oxidation is being performed through reactive film formation. At that time, the film formation is performed while the oxidizing power for the alloy is being adjusted so that the finally obtained tunnel barrier layer has an oxygen deficient state. To be specific, the oxidizing power to be supplied is less than the oxidizing power sufficient to oxidize the alloy to be film-formed. By performing this treatment, the tunnel barrier layer has an oxygen deficient state and the crystal structure of the tunnel barrier layer has a disordered spinel structure.

In the case where an alloy expressed by a composition expression of $Mg_xAl_{1-x}$ (where, $0 \leq x < 1$) is deposited while the alloy is oxidized by reactive deposition, it is preferable that the deposition is performed a metal mode or a transition mode.

In the reactive deposition, the deposition rates differ significantly depending on the flow rate of the reactive gas (oxygen) to be introduced. A state in which the flow rate of oxygen is small and the deposition rate at which the target material scatters in the state of metal is high is called the metal mode. In addition, a state in which the flow rate of oxygen is high and the deposition rate at which the target material scatters as a compound while reacting with oxygen is slow is called the reactive (oxidation) mode. The mode performed in a deposition rate between that of the metal mode and that of the oxidation mode is called the transition mode.

Before forming the film of the MgAl alloy in the second method and the third method, in view of protection of the first ferromagnetic layer, a barrier underlayer including a composition ratio of $Mg_zAl_{1-z}$ ($0 \leq z \leq 1$) may be laminated. By the subsequent heat treatment, the barrier underlayer becomes a part of the tunnel barrier layer which is an oxide of $Mg_xAl_{1-x}$.

Further, in the first method, the second method, and the third method, a Mg layer may be formed by depositing Mg after forming a layer made of an oxide of $Mg_xAl_{1-x}$. The Mg layer becomes a part of the tunnel barrier layer which is an oxide of $Mg_xAl_{1-x}$ by a subsequent heat treatment.

As described above, according to a method for manufacturing the magnetoresistance effect element according to the embodiment, it is possible to easily produce the tunnel barrier layer having a predetermined composition. Furthermore, when the tunnel barrier layer has a predetermined composition, the crystal structure of the tunnel barrier layer has a disordered spinel structure and it is possible to produce the magnetoresistance effect element having a large MR ratio.

EXAMPLE

Comparative Example 1

A magnetoresistance effect element 10 illustrated in FIG. 1 was produced above a MgO (001) single crystal substrate. First, 40 nm of Cr was laminated as an underlayer above the substrate and subjected to a heat treatment at 800° C. for one hour. 30 nm of Fe was laminated as a first ferromagnetic layer 1 and subjected to a heat treatment at 300° C. for 15 minutes.

Subsequently, a 0.2 nm of a barrier underlayer made of Mg was formed above the first ferromagnetic layer 1, natural oxidation was carried out each time 0.4 nm of an alloy expressed by $Mg_{17}Al_{83}$ was formed, and this process was carried out twice. As a result, an oxide film having a total thickness of 0.8 nm was obtained. Natural oxidation was performed through exposure to oxygen at a pressure of 5 Pa for 600 seconds. By repeating this oxidation, the MgAl layer was sufficiently oxidized. After oxidation, a heat treatment was carried out in a vacuum at 400° C. for 15 minutes to obtain a homogeneous Mg—Al—O layer.

Subsequently, 6 nm of Fe was laminated as a second ferromagnetic layer 2 above the tunnel barrier layer 3 and subjected to a heat treatment at 350° C. for 15 minutes to obtain a ferromagnetic tunnel junction. Subsequently, 12 nm of IrMn was formed as an antiferromagnetic layer and 20 nm of Ru was formed as a cap layer to obtain a magnetoresistance effect element 10. Finally, a heat treatment was applied at a temperature of 175° C. for 30 minutes while applying a magnetic field of 5 kOe to impart uniaxial magnetic anisotropy to the second ferromagnetic layer 2.

Also, slice samples of the tunnel barrier layer were produced by cutting the produced magnetoresistance effect element 10 using a focused ion beam along a surface in a lamination direction. Moreover, compositions of the slice samples were analyzed using an energy dispersive X-ray analysis (EDS) in a transmission electron microscope (TEM). As a result, a composition of a Mg—Al—O layer was $Mg_{0.18}Al_{0.23}O_{0.59}$. In the case of $\alpha=0.18$ and $\beta=0.23$, when $\gamma \geq 0.59$ is satisfied, it can be said that the Mg—Al—O layer has a fully oxidized state. That is to say, Comparative Example 1 is in a fully oxidized state. It should be noted that an analytical method is not limited to this and can also be performed using a secondary ion mass spectrometry method (SIMS), an atom probe method, and electron energy loss spectroscopy (EELS).

Note that the analysis results of the TEM-EDS were values obtained by subtracting background signals of measurement elements (Mg, Al, and O).

Figure 4:
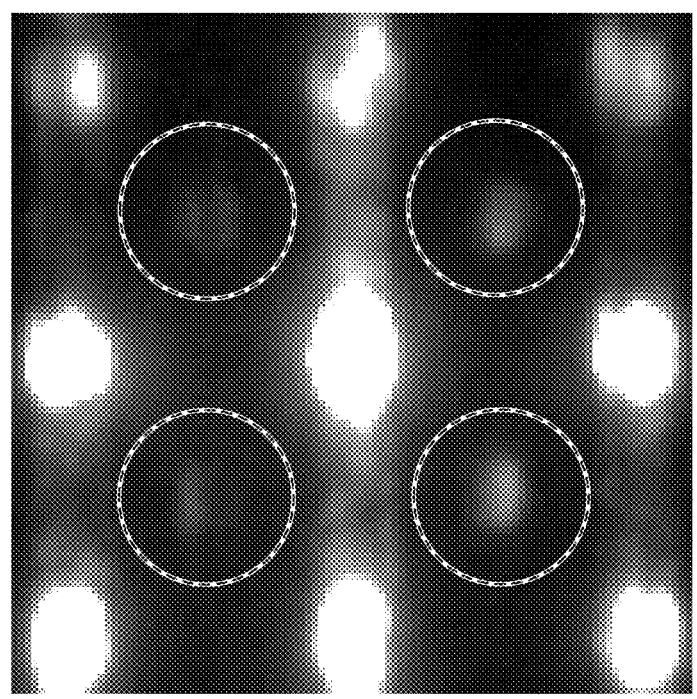
FIG. 4 illustrates a result obtained by performing nano-electron beam diffraction (NBD) on a tunnel barrier layer according to Comparative Example 1 using a transmission electron microscope (TEM).

Also, a nano-electron beam diffraction (NBD) was also performed using a transmission electron microscope (TEM). To be specific, the slice samples were irradiated with an electron beam narrowed down to a diameter of about 1 nm and a transmission diffraction electron beam was measured. FIG. 4 illustrates the result of an electron beam incident in a Mg—Al—O [100] orientation.

Example 1

Example 1 is different from Comparative Example 1 in that, when a Mg—Al—O layer is produced, oxygen deficiency is caused in Example 1. To be specific, first, 0.2 nm of a barrier underlayer made of Mg was formed. After that, 0.5 nm of an alloy expressed by $Mg_{17}Al_{83}$ was laminated at once and an oxidation treatment under the same condition as in Comparative Example 1 was performed. This oxidation condition is an oxygen deficient oxidation condition. After oxidation, a heat treatment was performed in vacuum at 400° C. for 15 minutes to obtain a Mg—Al—O layer. Other conditions and analysis methods were the same as in Example 1.

A composition of the Mg—Al—O layer in Example 1 was $Mg_{0.21}Al_{0.22}O_{0.57}$. In this case of $\alpha=0.21$ and $\beta=0.22$, when $\gamma \geq 0.60$ is satisfied, it can be said that the Mg—Al—O layer has a fully oxidized state. That is to say, in Example 1, oxygen is deficient relative to a fully oxidized state.

Figure 5:
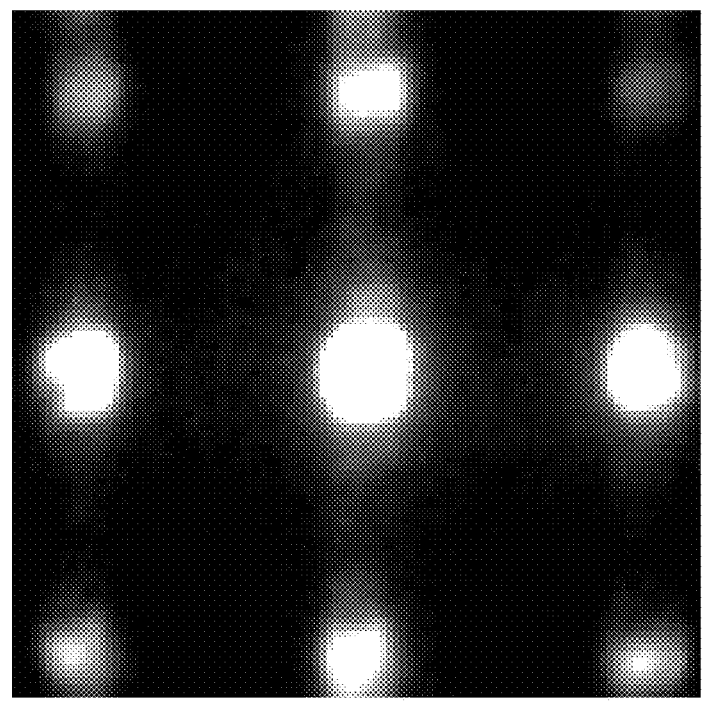
FIG. 5 illustrates a result obtained by performing nano-electron beam diffraction (NBD) on a tunnel barrier layer according to Example 1 using a transmission electron microscope (TEM).

FIG. 5 illustrates a result of NBD also performed on the tunnel barrier layer according to Example 1 using a TEM. In the NBD pattern illustrated in FIG. 5, unlike the NBD pattern in Comparative Example 1 illustrated in FIG. 4, a part of diffraction spots was not confirmed. Since an electron diffraction pattern can be regarded as a pattern obtained by performing Fourier-transformation on a crystal lattice, an effective change in lattice constant and a change in crystal symmetry can be observed. An additional spot observed in a region enclosed by a dotted line in Comparative Example 1 is generated due to the ordered arrangement of cations of an ordered spinel structure, which indicates that there is reflection from an $MgAl_2O_4$ {220} surface. On the other hand, since only the basic reflection from a body centered cubic (BCC) lattice is observed in Example 1, a sample has a disordered spinel structure. From these facts, the effective lattice constant of the tunnel barrier layer in Comparative Example 1 is an ordered spinel structure which is twice the effective lattice constant of the tunnel barrier layer in Example 1.

Also, ten samples having a tunnel barrier layer in Example 1 were produced and it was confirmed that all of the ten samples had spot images illustrated in FIG. 5. That is to say, the tunnel barrier layers in Example 1 had a stably disordered spinel structure. On the other hand, in a tunnel barrier layer in Comparative Example 1, diffraction spots hardly appear within a region surrounded by a dotted line in some cases, but substantially the same spot image as in FIG. 4 was obtained. That is to say, the tunnel barrier layer in Comparative Example 1 could not stably exhibit a disordered spinel structure.

It should be noted that Japanese Patent No. 5586028 discloses that, when a tunnel barrier layer has a disordered spinel structure, the tunnel barrier layer has a high MR ratio. For example, Japanese Patent No. 5586028 discloses that a tunnel barrier of a disordered spinel structure produced from 1.45 nm of MgAl can have a very high MR ratio of 308% at room temperature.

Example 2

Example 2 and Example 1 differ in that a thickness of an alloy expressed by $Mg_{17}Al_{83}$ was set to 0.8 nm in Example 2. Other conditions and analysis methods were the same as in Example 1.

A composition of an Mg—Al—O layer in Example 2 was $Mg_{0.19}Al_{1.27}O_{0.54}$. In the case of $\alpha=0.19$ and $\beta=0.27$, when $\gamma \geq 0.67$ is satisfied, it can be said that the Mg—Al—O layer has a fully oxidized state. That is to say, in Example 2, oxygen is deficient relative to a fully oxidized state. An NBD pattern of the tunnel barrier layer in Example 2 was the same as the pattern of the tunnel barrier layer in Example 1 (FIG. 5).

Example 3

Example 3 and Example 1 differ in that a barrier underlayer made of Mg was formed to have a thickness of 0.45 nm, a thickness of an alloy expressed by $Mg_{17}Al_{83}$ was set to 0.63 nm, and an Mg—Al—O layer was oxidized using a reactive film formation method in Example 3. The reactive film formation method is a method for forming a film while performing oxidation by introducing oxygen during formation of a film of an Mg—Al alloy and a gas flow rate was set to have a condition of 20 sccm of Ar and 2 sccm of oxygen. Other conditions and analysis methods were the same as in Example 1.

A composition of an Mg—Al—O layer in Example 3 was $Mg_{0.24}Al_{0.24}O_{0.52}$. In the case of $\alpha=0.24$ and $\beta=0.24$, when $\gamma \geq 0.67$ is satisfied, it can be said that the Mg—Al—O layer has a fully oxidized state. That is to say, in Example 3, oxygen is deficient relative to a fully oxidized state. Furthermore, an NBD pattern of the tunnel barrier layer in Example 3 was the same as the pattern of the tunnel barrier layer in Example 1 (FIG. 5).

Example 4

Example 4 and Example 3 differ in that a thickness of an alloy expressed by $Mg_{17}Al_{83}$ was set to 1.5 nm in Example 4. Other conditions and analysis methods were the same as in Example 3.

A composition of an Mg—Al—O layer in Example 4 was $Mg_{0.19}Al_{0.24}O_{0.57}$. In the case of $\alpha=0.19$ and $\beta=0.24$, when $\gamma \geq 0.62$ is satisfied, it can be said that the Mg—Al—O layer has a fully oxidized state. That is to say, in Example 4, oxygen is deficient relative to the fully oxidized state. Furthermore, an NBD pattern of the tunnel barrier layer in Example 4 was the same as the pattern of the tunnel barrier layer in Example 1 (FIG. 5).

Example 5

Example 5 and Example 3 differ in that a thickness of an alloy expressed by $Mg_{17}Al_{83}$ is set to 1.9 nm in Example 5. Other conditions and analysis methods were the same as in Example 3.

A composition of an Mg—Al—O layer in Example 5 was $Mg_{0.13}Al_{0.29}O_{0.58}$. In the case of $\alpha=0.13$ and $\beta=0.29$, when $\gamma \geq 0.63$ is satisfied, it can be said that the Mg—Al—O layer has a fully oxidized state. That is to say, in Example 5, oxygen is deficient relative to the fully oxidized state.

Furthermore, an NBD pattern of the tunnel barrier layer in Example 5 was the same as the pattern of the tunnel barrier layer in Example 1 (FIG. 5).

Example 6

In the formation of a tunnel barrier layer in Example 6, a film of pure Al was formed to have a thickness of 1.3 nm and then oxidized using oxygen plasma. A gas (a total of 6 Pa) obtained by mixing oxygen gas with Ar gas at 5 Pa at 5:1 as plasma oxidation conditions was used. The oxygen plasma was formed under the condition of a high frequency power density of 0.34 W/cm$^2$ and an Al layer was directly exposed to this plasma for 15 seconds. Other conditions and analysis methods were the same as in Example 1.

An Al—O layer in Example 6 was obtained as a single crystal layer grown to have a (001) surface and a composition thereof was $Al_{0.47}O_{0.53}$. In the case of $\alpha=0$ and $\beta=0.47$, when $\gamma \geq 0.79$ is satisfied, it can be said that the Mg—Al—O layer has a fully oxidized state. That is to say, in Example 4, oxygen is deficient relative to the fully oxidized state. Furthermore, an NBD pattern of the tunnel barrier layer in Example 6 was the same as the pattern of the tunnel barrier layer in Example 1 (FIG. 5).

Example 7

In Example 7, a barrier underlayer made of Mg was formed to have a thickness of 0.3 nm, an alloy represented by $Mg_{67}Al_{33}$ was formed to have a thickness of 0.1 nm, and oxidation treatment was performed under the same conditions as in Example 1.

After that, an oxidation treatment was carried out under the same conditions as in Example 1 every time an alloy represented by $Mg_{67}Al_{33}$ was formed in a thickness of 0.2 nm. The deposition of the alloy and the subsequent oxidation treatment were repeated four times. Thereafter, Mg was deposited to a thickness of 0.2 nm. Other conditions and analysis method were the same as in Example 1.

A composition of an Mg—Al—O layer in Example 7 was $Mg_{0.41}Al_{0.06}O_{0.53}$. In the case of $\alpha=0.41$ and $\beta=0.06$, when $\gamma \geq 0.56$ is satisfied, it can be said that the Mg—Al—O layer has a fully oxidized state. That is to say, in Example 7, oxygen is deficient relative to the fully oxidized state. Furthermore, an NBD pattern of the tunnel barrier layer in Example 7 was the same as the pattern of the tunnel barrier layer in Example 1 (FIG. 5).

The above results are summarized in Table 1.

As can be seen from Table 1, it is understood that, in any of examples, a disordered spinel structure can be obtained by setting an amount of oxygen to be lower than the amount of oxygen in the tunnel barrier layer 3 of the ordered spinel structure described in Comparative Example 1.

While preferred embodiments of the invention have been described and illustrated above, it should be understood that these are exemplary of the invention and are not to be considered as limiting. Additions, omissions, substitutions, and other modifications can be made without departing from the spirit or scope of the present disclosure. Accordingly, the invention is not to be considered as being limited by the foregoing description, and is only limited by the scope of the appended claims.

EXPLANATION OF REFERENCES

1 First ferromagnetic layer
2 Second ferromagnetic layer
3 Tunnel barrier layer
10 Magnetoresistance effect element

What is claimed is:

1. A magnetoresistance effect element comprising:
a first ferromagnetic layer;
a second ferromagnetic layer; and
a tunnel barrier layer disposed between the first ferromagnetic layer and the second ferromagnetic layer,
wherein the tunnel barrier layer is an oxide of $Mg_xAl_{1-x}$ ($0 \leq x < 1$) and
an amount of oxygen in the tunnel barrier layer is lower than an amount of oxygen in a fully oxidized state in which the oxide has an ordered spinel structure.

2. The magnetoresistance effect element according to claim 1, wherein the amount of oxygen in the tunnel barrier layer is 67% or more of the amount of oxygen in the fully oxidized state.

3. The magnetoresistance effect element according to claim 1, wherein the amount of oxygen in the tunnel barrier layer is 67% or more and 95% or less of the amount of oxygen in the fully oxidized state.

4. The magnetoresistance effect element according to claim 1, wherein the amount of oxygen in the tunnel barrier layer is 77% or more and 95% or less of the amount of oxygen in the fully oxidized state.

5. The magnetoresistance effect element according to claim 1, wherein the oxide is expressed by a composition expression of $Mg_\alpha Al_\beta O_\gamma$, and $\alpha$ satisfies $0 \leq \alpha \leq 0.41$ in the composition expression.

TABLE 1

|  | Analysis result using TEM-EDS | | | Standardized value | | | | Amount of oxygen | | |
| --- | --- | --- | --- | --- | --- | --- | --- | --- | --- | --- |
|  | Mg | Al | O | Mg | Al | O | Stoichiometry | Full Oxidization | Actual measurement/Full oxidation (%) | Crystal structure |
| Comparative Example 1 | 13.3 | 16.6 | 43.6 | 0.18 | 0.23 | 0.59 | 0.53 | 0.59 | 100 | Spinel |
| Example 1 | 16.7 | 17.8 | 46.6 | 0.21 | 0.22 | 0.57 | 0.54 | 0.60 | 94 | Disordered spinel |
| Example 2 | 15.9 | 22.5 | 43.9 | 0.19 | 0.27 | 0.54 | 0.60 | 0.67 | 81 | Disordered spinel |
| Example 3 | 14.6 | 14.6 | 32.2 | 0.24 | 0.24 | 0.52 | 0.60 | 0.60 | 77 | Disordered spinel |
| Example 4 | 10.8 | 13.8 | 32.9 | 0.19 | 0.24 | 0.57 | 0.55 | 0.62 | 93 | Disordered spinel |
| Example 5 | 11.4 | 23.7 | 48.0 | 0.13 | 0.29 | 0.58 | 0.57 | 0.63 | 92 | Disordered spinel |
| Example 6 | 0.0 | 28.0 | 32.0 | 0.00 | 0.47 | 0.53 | 0.71 | 0.79 | 67 | Disordered spinel |
| Example 7 | 31.3 | 4.8 | 40.2 | 0.41 | 0.06 | 0.53 | 0.50 | 0.56 | 95 | Disordered spinel |

6. The magnetoresistance effect element according to claim 5, wherein α satisfies 0.13≤α≤0.41 in the composition expression.

7. The magnetoresistance effect element according to claim 1, wherein a crystal mainly constituting the tunnel barrier layer is (001)-oriented.

8. The magnetoresistance effect element according to claim 1, wherein at least one of the first ferromagnetic layer and the second ferromagnetic layer contains the element Fe.

9. The magnetoresistance effect element according to claim 1, wherein a thickness of the tunnel barrier layer is 3 nm or less.

10. A method for manufacturing the magnetoresistance effect element according to claim 1 comprising:
a step of preparing a target made of the oxide; and
a step of laminating the tunnel barrier layer using the target.

11. A method for manufacturing the magnetoresistance effect element according to claim 1 comprising:
a step of depositing an alloy expressed by a composition expression of $Mg_xAl_{1-x}$ (where, 0≤x<1); and
a step of oxidizing the alloy to form the tunnel barrier layer.

12. The method for manufacturing the magnetoresistance effect element according to claim 11, wherein
an alloy expressed by a composition expression of $Mg_xAl_{1-x}$ (where, 0≤x<0.5) is deposited in the step of depositing an alloy, and
each of the step of depositing an alloy and the step of oxidizing the alloy performed after the step of depositing is performed only once.

13. The method for manufacturing the magnetoresistance effect element according to claim 11, wherein
an alloy expressed by a composition expression of $Mg_xAl_{1-x}$ (where, 0.5≥x<1) is deposited in the step of depositing an alloy, and
each of the step of depositing an alloy and the step of oxidizing the alloy performed after the step of depositing is repeated multiple times.

14. The method for manufacturing the magnetoresistance effect element according to claim 1, the method further comprises a step of depositing Mg after performing the step of depositing an alloy and the step of oxidizing the alloy.

15. A method for manufacturing the magnetoresistance effect element according to claim 1, the method comprises a step of depositing an alloy expressed by a composition expression of $Mg_xAl_{1-x}$ (where, 0≤x<1) in a metal mode or a transition mode while the alloy is oxidized by reactive deposition.

16. The method for manufacturing the magnetoresistance effect element according to claim 15, wherein the method further comprises a step of deposing Mg after performing the step of depositing an alloy in the metal mode or the transition mode while the alloy is oxidize by reactive deposition.

* * * * *